United States Patent
Torres et al.

(10) Patent No.: US 7,208,993 B2
(45) Date of Patent: Apr. 24, 2007

(54) INPUT CURRENT LEAKAGE CORRECTION FOR MULTI-CHANNEL LVDS FRONT MULTIPLEXED REPEATERS

(75) Inventors: Hector Torres, McKinney, TX (US); Mark W. Morgan, Allen, TX (US); Julie Hwang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 616 days.

(21) Appl. No.: 10/386,146

(22) Filed: Mar. 11, 2003

(65) Prior Publication Data

US 2004/0178832 A1 Sep. 16, 2004

(51) Int. Cl.
*H03K 17/62* (2006.01)

(52) U.S. Cl. ............... 327/403; 327/404; 327/407; 327/410; 327/108; 326/82; 326/83

(58) Field of Classification Search ............... 327/403, 327/404, 407, 408, 99, 410; 326/86
See application file for complete search history.

(56) References Cited

U.S. PATENT DOCUMENTS

| | | | | |
|---|---|---|---|---|
| 5,338,987 A | | 8/1994 | Tomasetti et al. ............ | 327/108 |
| 5,955,912 A | * | 9/1999 | Ko ............................... | 327/410 |
| 5,987,543 A | | 11/1999 | Smith .......................... | 710/70 |
| 6,100,719 A | * | 8/2000 | Graves et al. ................ | 326/86 |
| 6,369,621 B1 | | 4/2002 | Tinsley et al. ............... | 327/108 |

OTHER PUBLICATIONS

*1.5 Gdps LVDS 4×4 Crosspoint Switch*; Texas Instruments, SN67LVDS125, SN65LVDT125, SLLS555A—Dec. 2002, Revised Feb. 2003.

* cited by examiner

Primary Examiner—Tuan T. Lam
Assistant Examiner—Hiep Nguyen
(74) Attorney, Agent, or Firm—W. James Brady, III; Frederick J. Telecky, Jr.

(57) ABSTRACT

A high-speed front-multiplexed multi-channel LVDS-compatible repeater circuit that limits input leakage current levels in the event one or more input voltages of the circuit exceeds the supply voltage. The LVDS repeater includes a multiplexor having a plurality of differential inputs and at least one differential output. The multiplexor includes a plurality of transmission gates to allow any one of the differential inputs to be routed to any differential output. Each transmission gate includes a first PMOS transistor and an NMOS transistor. The multiplexor further includes first Schottky diodes coupled between Vcc and the back-gate nodes of the first PMOS transistors, and second PMOS transistors coupled as shunts between the gate nodes of the first PMOS transistors and the source nodes of the NMOS transistors. The first Schottky diodes block the back-gate diode-to-Vcc leakage current paths and the second PMOS transistors block the leakage current paths from the differential inputs to the first PMOS transistors when the input voltage exceeds Vcc.

7 Claims, 6 Drawing Sheets

*Fig. 1 - Prior Art*

INPUT CURRENT LEAKAGE CORRECTION FOR MULTI-CHANNEL LVDS FRONT MULTIPLEXED REPEATERS

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates generally to differential driver circuits, and more specifically to a high-speed multi-channel differential driver circuit that is LVDS compatible.

In recent years, Low Voltage Differential Signaling (LVDS) technology has been increasingly employed in high-speed data transmission systems. In general, LVDS technology is a signaling method used for high-speed low-power data transmission over transmission media such as Printed Circuit Board (PCB) traces, backplanes, and cables. The LVDS signaling method, which conforms to the TIA/EIA-644 standard, uses low voltage levels (e.g., less than 5 volts) to allow operation with decreased power supply levels, to reduce power consumption, and to increase switching speeds.

According to the TIA/EIA-644 standard, the input leakage current for an LVDS-compatible circuit is specified to be less than 20 µA, which can be problematic for high-speed multi-channel differential driver circuits such as high-speed multi-channel repeaters. This is because such high-speed repeaters typically include a multiplexor, which may be placed at the front of the signal chain within the repeater circuit. By placing the multiplexor at the front of the signal chain, the high-speed repeater can be configured such that each driver within the circuit is connected to only one receiver, thereby avoiding problems related to internal loading and assuring that consistent AC performance is achieved.

However, such front-multiplexed multi-channel repeater circuits have drawbacks in that high input leakage can occur under certain operating conditions. For example, the multiplexor of the conventional front-multiplexed repeater may include a plurality of transmission gates. Because of the PMOS transistor back-gate diode-to-power supply current paths within the transmission gates, input leakage current levels can increase when an input voltage of the multiplexor exceeds the supply voltage, thereby making it difficult to meet the input leakage requirement called out in the TIA/EIA-644 specification.

It would therefore be desirable to have a high-speed multi-channel differential driver circuit that conforms to the TIA/EIA-644 specification, and avoids the drawbacks of the above-described conventional front-multiplexed multi-channel repeater.

BRIEF SUMMARY OF THE INVENTION

In accordance with the present invention, a high-speed front-multiplexed multi-channel LVDS-compatible repeater circuit is disclosed that limits input leakage current levels in the event one or more input voltages of the circuit exceeds the supply voltage.

In one embodiment, the multi-channel LVDS repeater includes at least one multiplexor having a plurality of differential inputs and at least one differential output. The multiplexor includes a plurality of transmission gates configured to allow any one of the differential inputs to be routed to any differential output. Each transmission gate includes a first PMOS pass transistor and an NMOS pass transistor. The multiplexor further includes respective first Schottky diodes coupled between the supply voltage (Vcc) and the back-gate nodes of the first PMOS transistors, and respective second PMOS transistors coupled as shunts between the gate nodes of the first PMOS transistors and the source nodes of the NMOS transistors. The first Schottky diodes are configured to block the back-gate diode-to-Vcc leakage current paths, and the second PMOS transistors are configured to block the leakage current paths from the respective differential inputs to the first PMOS transistors when an input voltage exceeds Vcc and the first PMOS transistor is deactivated (i.e., turned "off"). The multiplexor further includes control logic circuitry coupled to the gate node of the first PMOS transistor. In the preferred embodiment, the control logic circuitry comprises a NAND gate including a plurality of PMOS pull-up transistors, a plurality of serially-connected NMOS transistors, and a second Schottky diode coupled between the PMOS transistors and the NMOS transistors. The second Schottky diode is configured to block the leakage current path to Vcc within the NAND gate when the second PMOS transistor is activated (i.e., turned "on").

By configuring the multiplexor of the high-speed front-multiplexed LVDS repeater circuit to block various leakage current paths that may occur under certain operating conditions, e.g., when an input voltage exceeds the supply voltage Vcc, the front-multiplexed LVDS repeater can be made to satisfy the input leakage requirement specified in the TIA/EIA-644 standard.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

A high-speed front-multiplexed multi-channel repeater circuit is provided that is LVDS compatible. The presently disclosed multi-channel LVDS repeater circuit is configured to limit input leakage current in the event the level at one or more voltage inputs of the circuit exceeds the supply voltage level.

Figure 1:
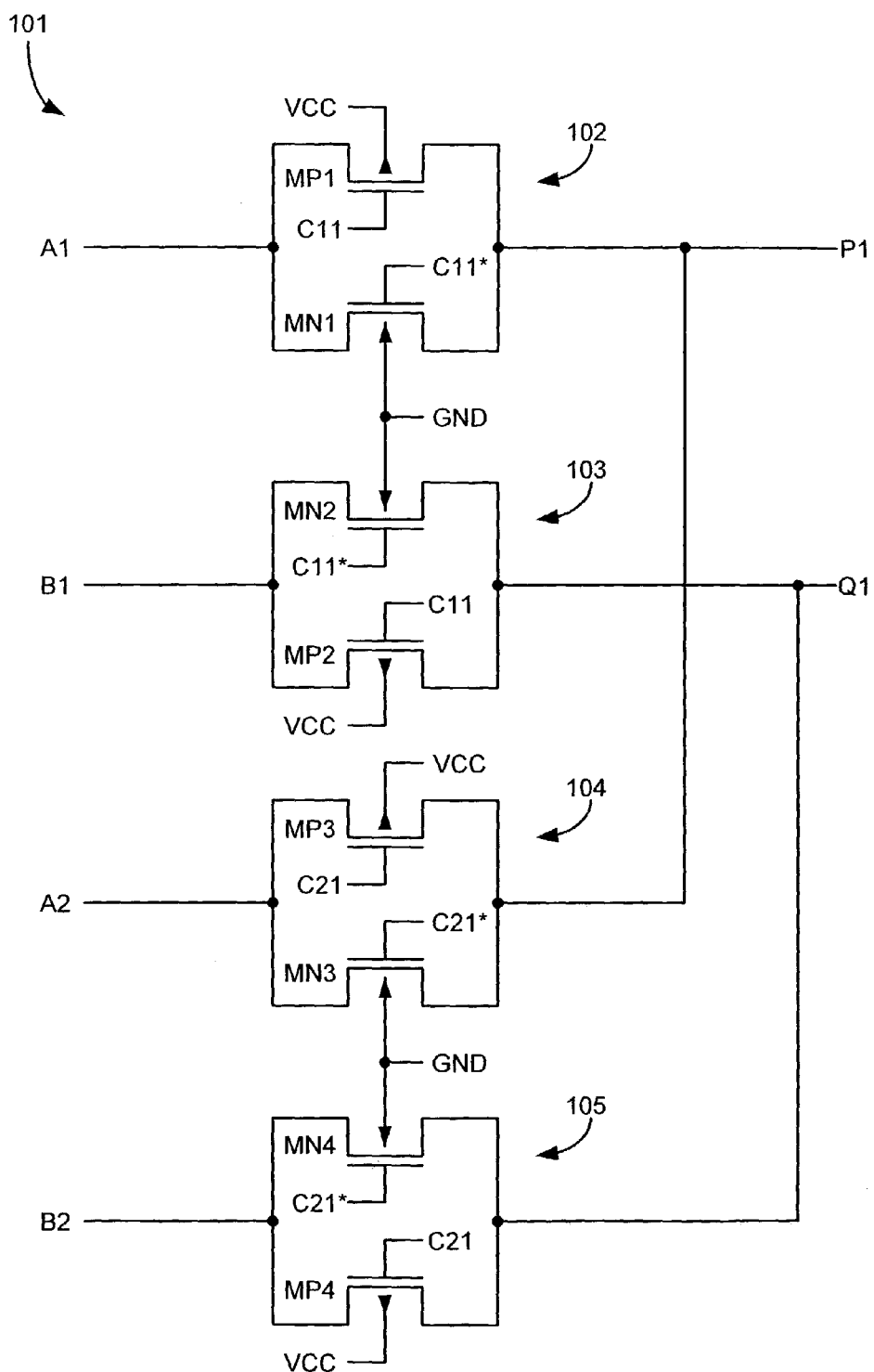
FIG. 1 is a schematic diagram of a 2-to-1 multiplexor included in a conventional high-speed multi-channel repeater.

FIG. 1 depicts a 2-to-1 multiplexor 101 that may be employed in a conventional high-speed multi-channel repeater circuit (not shown). The multiplexor 101 comprises a plurality of transmission gates 102–105, in which each transmission gate includes a respective PMOS transistor and a respective NMOS transistor. Specifically, the transmission gate 102 includes a PMOS transistor MP1 and an NMOS transistor MN1, the transmission gate 103 includes a PMOS transistor MP2 and an NMOS transistor MN2, the transmission gate 104 includes a PMOS transistor MP3 and an NMOS transistor MN3, and the transmission gate 105 includes a PMOS transistor MP4 and an NMOS transistor MN4. The multiplexor 101 further includes a plurality of differential inputs A1,B1 and A2,B2, and a differential output P1,Q1. Accordingly, the transmission gates 102–105 are configured to allow a differential signal applied to either one of the differential inputs A1,B1 and A2,B2 to be routed to the differential output P1,Q1.

As shown in FIG. 1, the back-gate node of each of the PMOS transistors MP1–MP4 is connected to the supply voltage Vcc, and the back-gate node of each of the NMOS transistors MN1–MN4 is connected to ground potential GND, as is customary in the this art. Further, a control signal C11 is applied to the gate nodes of the PMOS transistors MP1 and MP2, and a control signal C11* (i.e., the inverse of the control signal C11) is applied to the gate nodes of the NMOS transistors MN1–MN2. Similarly, a control signal C21 is applied to the gate nodes of the PMOS transistors MP3 and MP4, and a control signal C21* (i.e., the inverse of the control signal C21) is applied to the gate nodes of the NMOS transistors MN3–MN4. Suitable control circuitry (not shown) may be employed to generate and apply the control signals C11,C11* and C21,C21* to the transmission gates 102–105 to affect the desired routing of the differential inputs A1,B1 and A2,B2 to the differential output P1,Q1.

As described above, the 2-to-1 multiplexor 101 may be employed in a conventional high-speed multi-channel repeater circuit. To obviate the need to address potential internal loading problems within the high-speed repeater, the multiplexor 101 may be placed at the front of a signal chain within the high-speed repeater to form a front-multiplexed multi-channel repeater circuit. However, high input leakage can occur under certain operating conditions, e.g., when an input voltage of the multiplexor 101 exceeds the supply voltage Vcc. This is typically due at least in part to the PMOS transistor back-gate diode-to-Vcc current paths within the transmission gates 102–105. As a result, it is difficult to make the conventional front-multiplexed repeater circuit conform to the input leakage requirements called out in the TIA/EIA-644 specification.

Figure 2:
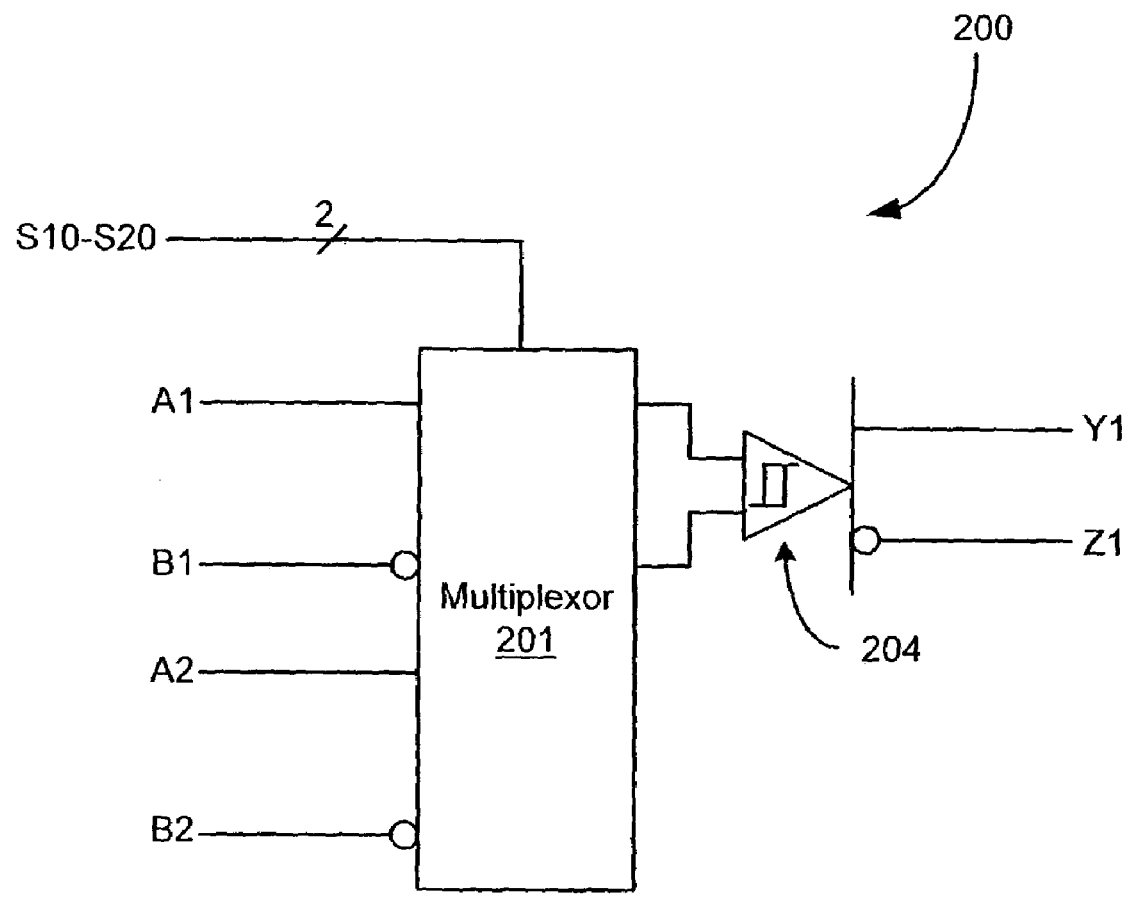
FIG. 2 is a schematic diagram of a high-speed multi-channel LVDS repeater according to the present invention.

FIG. 2 depicts an illustrative embodiment of a high-speed front-multiplexed multi-channel LVDS-compatible repeater circuit 200, in accordance with the present invention. In the illustrated embodiment, the high-speed front-multiplexed LVDS repeater 200 includes a plurality of differential inputs A1,B1 and A2,B2, a plurality of control inputs S10–S20, a 2-to-1 multiplexor 201, a differential output driver 204 such as a Schottky output driver or any other suitable output driver, and a differential output Y1,Z1. It is noted that the front-multiplexed LVDS repeater 200 is configured to perform differential data transmission by conveying signals with opposite voltage/current swings over the respective differential inputs A1,B1 and A2,B2, and that the multiplexor 201 is configured to allow any one of the differential inputs to be routed to the differential output. It should be understood that the front-multiplexed LVDS repeater 200 may alternatively include any suitable number of differential inputs/outputs and output drivers.

Those of ordinary skill in this art will appreciate that a Low Voltage Differential Signaling (LVDS) circuit is made to conform to the requirements of the TIA/EIA-644 standard, e.g., the TIA/EIA-644 standard as disclosed in the ANSI TIA/EIA-644-A LVDS specification, which is incorporated herein by reference. In general, the TIA/EIA-644 standard describes the AC and DC behavior of LVDS-compatible circuits under certain operating conditions. For example, the TIA/EIA-644 standard calls for the input leakage of an LVDS-compatible circuit having a differential input to be less than 20 μA under the following operating conditions: Vcc=1.5 volts, the first signal path of the differential input is tied to 2.4 volts, and the second signal path of the differential input is tied to 1.2 volts.

Figure 3:
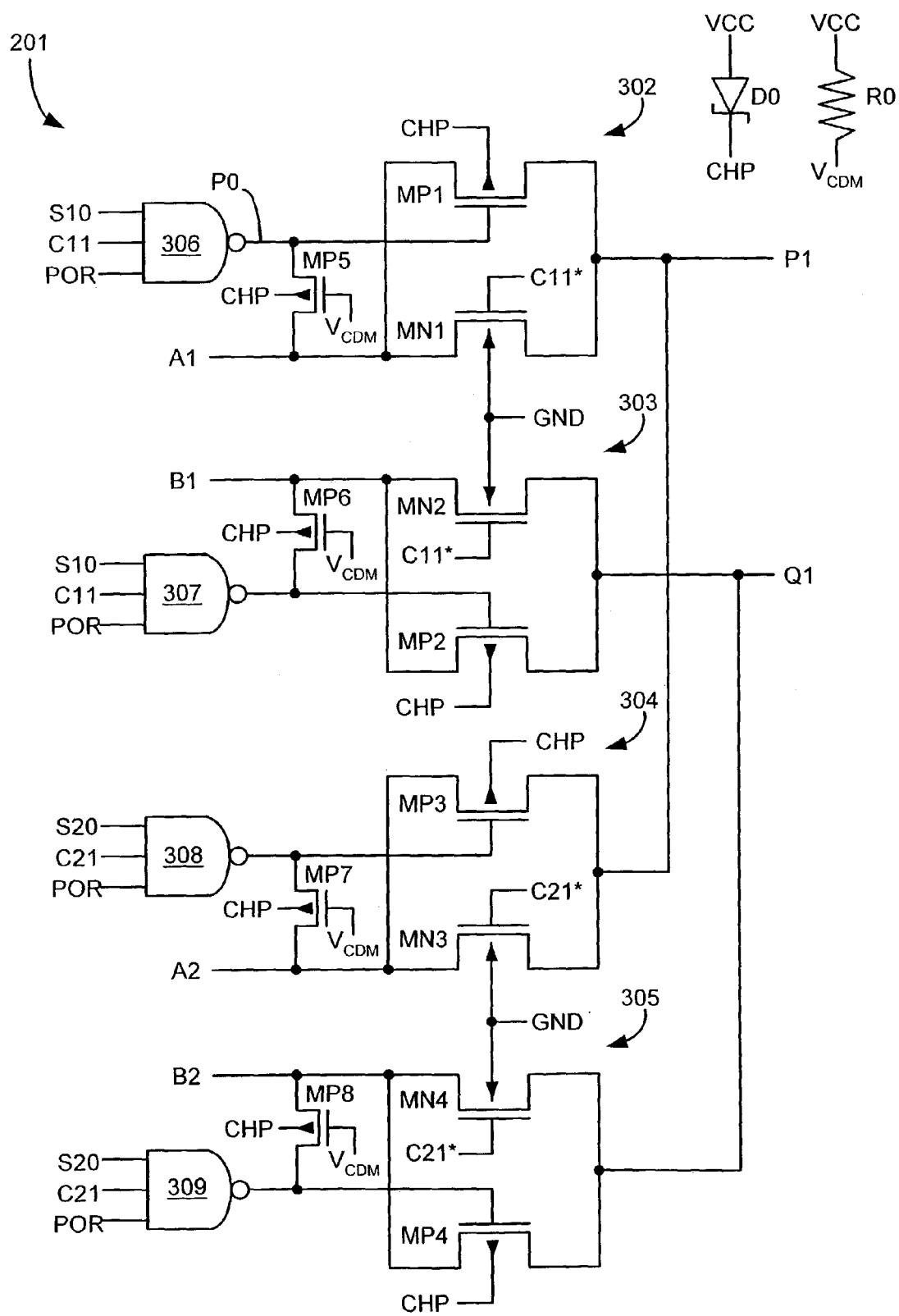
FIG. 3 is a schematic diagram of a 2-to-1 multiplexor included in the high-speed multi-channel LVDS repeater of FIG. 2.

FIG. 3 schematically depicts an illustrative embodiment of the 2-to-1 multiplexor 201 included in the front-multiplexed LVDS repeater 200 (see FIG. 2). The multiplexor 201 of FIG. 3 is configured to allow the front-multiplexed LVDS repeater 200 to conform to the input leakage requirements called out in the TIA/EIA-644 specification. In the illustrated embodiment, the multiplexor 201 comprises a plurality of transmission gates 302–305, in which each transmission gate includes a respective PMOS pass transistor and a respective NMOS pass transistor. Specifically, the transmission gate 302 includes a PMOS transistor MP1 and an NMOS transistor MN1, the transmission gate 303 includes a PMOS transistor MP2 and an NMOS transistor MN2, the transmission gate 304 includes a PMOS transistor MP3 and an NMOS transistor MN3, and the transmission gate 305 includes a PMOS transistor MP4 and an NMOS transistor MN4. The multiplexor 201 further includes a plurality of differential inputs A1,B1 and A2,B2, and a differential output P1,Q1. The transmission gates 302–305 are configured to allow a differential signal applied to either one of the differential inputs A1,B1 and A2,B2 to be routed to the differential output P1,Q1.

As described above, when an input voltage of the multiplexor 101 (see FIG. 1) exceeds the supply voltage Vcc, high input leakage (e.g., >20 μA) can occur within the conventional front-multiplexed repeater due to the back-gate diode-to-Vcc current paths within the transmission gates 102–105. For example, such a high input leakage may occur in the conventional front-multiplexed repeater under the following operating conditions: Vcc=1.5 volts, a first signal path of the differential input A1,B1 (or A2,B2) is tied to 2.4 volts, and a second signal path of the differential input A1,B1 (or A2,B2) is tied to 1.2 volts. To alleviate this problem in the front-multiplexed LVDS repeater 200, the multiplexor 201 includes a blocking diode D0 (see FIG. 3) coupled between the supply voltage Vcc and the back-gate nodes of the PMOS transistors MP1, MP2, MP3, and MP4 to block the respective back-gate diode-to-Vcc leakage current paths. For example, the blocking diode D0 may comprise a Schottky blocking diode or any other suitable type of blocking element. For clarity of illustration, each back-gate node of the PMOS transistors MP1, MP2, MP3, and MP4 is depicted in FIG. 3 as being connected to a node CHP, which corresponds to the cathode of the Schottky diode D0. The anode of the Schottky diode D0 is connected to the supply voltage Vcc. As shown in FIG. 3, the back-gate node of each of the NMOS transistors MN1–MN4 is connected to ground potential GND.

The multiplexor 201 further includes control logic circuits 306–309 coupled to the gate nodes of the PMOS transistors MP1–MP4, respectively. The control logic circuits 306–307 are configured to apply a control signal C11 to the gate nodes of the PMOS transistors MP1–MP2, respectively, when the levels of control signals S10 and POR are logical high. Similarly, the control logic circuits 308–309 are configured to apply a control signal C21 to the gate nodes of the PMOS transistors MP3–MP4, respectively, when the levels of control signals S20 and POR are logical high. Further, a control signal C11* (i.e., the inverse of the control signal C11) is applied to the gate nodes of the NMOS transistors MN1–MN2, and a control signal C21* (i.e., the inverse of the control signal C21) is applied to the gate nodes of the NMOS transistors MN3–MN4. Suitable control circuitry (not shown) may be employed to generate and apply the control signals C11, C11*, C21, C21* S10, S20, and POR to the control logic circuits 306–309 and the NMOS transistors MN1–MN4 as required to affect the desired routing of the differential inputs A1,B1 and A2,B2 to the differential output P1,Q1.

It is noted that when an input voltage of the conventional multiplexor 101 (see FIG. 1) exceeds the supply voltage Vcc, at least a portion of the input current may flow into the PMOS transistors MP1, MP2, MP3, and MP4, e.g., when these transistors are deactivated (i.e., turned "off"). To alleviate this problem in the front-multiplexed LVDS repeater 200, the multiplexor 201 includes a plurality of blocking elements such as PMOS transistors MP5–MP8 (see FIG. 3) connected as a shunt across the source nodes of the respective NMOS transistors and the gate nodes of the respective PMOS transistors included in the transmission gates 302–305, thereby clamping the gate-to-source voltages. Specifically, the PMOS transistor MP5 is connected across the source node of the NMOS transistor MN1 and the gate node of the PMOS transistor MP1, the PMOS transistor MP6 is connected across the source node of the NMOS transistor MN2 and the gate node of the PMOS transistor MP2, the PMOS transistor MP7 is connected across the source node of the NMOS transistor MN3 and the gate node of the PMOS transistor MP3, and the PMOS transistor MP8 is connected across the source node of the NMOS transistor MN4 and the gate node of the PMOS transistor MP4.

As shown in FIG. 3, each of the back-gate nodes of the PMOS transistors MP5–MP8 is connected to the node CHP, i.e., the cathode of the Schottky diode D0, to block the respective back-gate diode-to-Vcc leakage current paths. Further, each of the gate nodes of the PMOS transistors MP5–MP8 is connected to a node VCDM, which corresponds to one end of a pull-up resistor R0. For clarity of illustration, each back-gate node of the PMOS transistors MP5–MP8 is depicted in FIG. 3 as being connected to the node CHP, and each gate node of the PMOS transistors MP5–MP8 is depicted as being connected to the node $V_{CDM}$. It is noted that the multiplexor 201 includes the resistor R0 to provide for Charged Device Model (CDM) protection.

Figure 4:
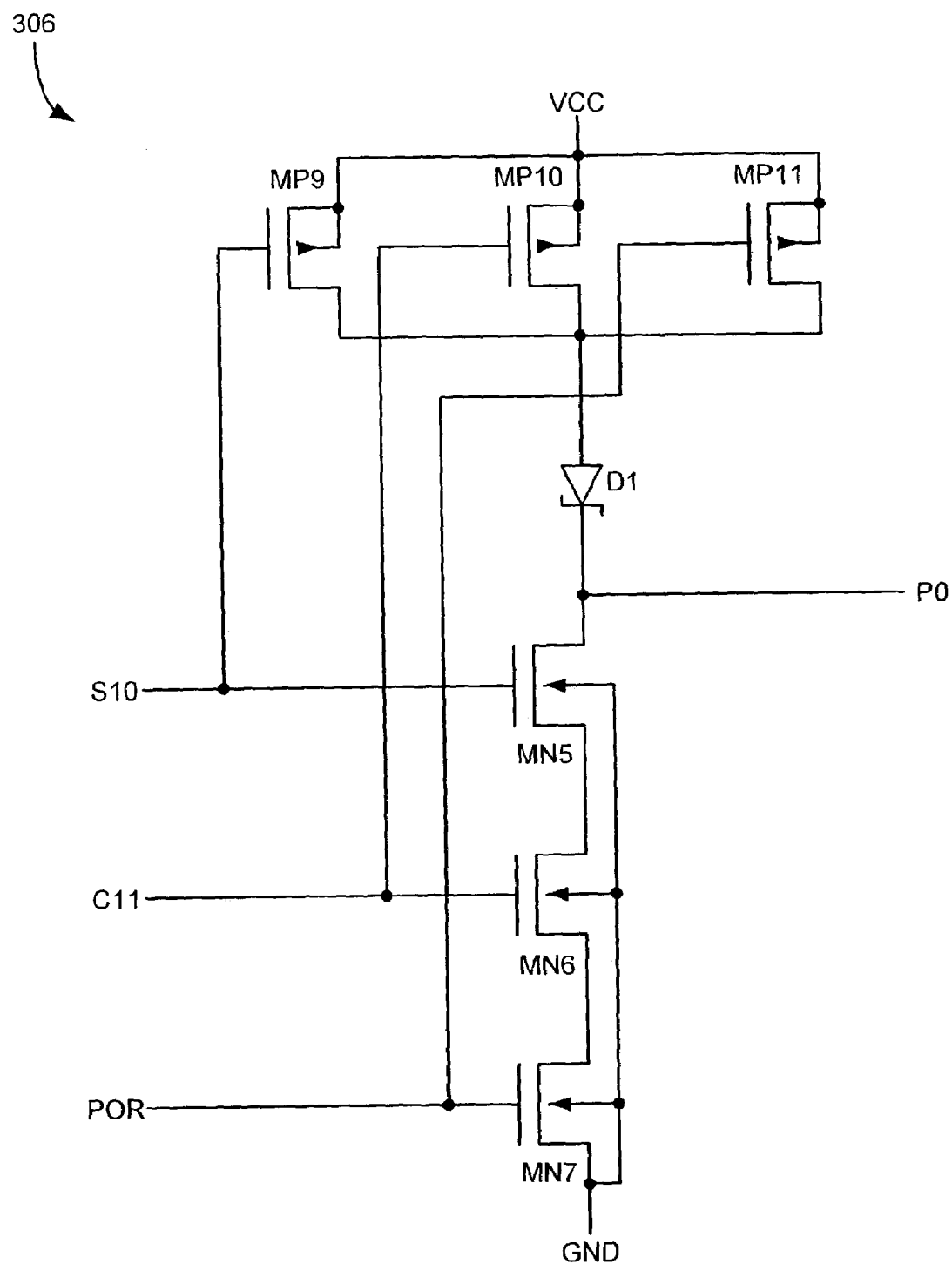
FIG. 4 is a schematic of control circuitry included in the multiplexor of FIG. 3.
Figure 5:
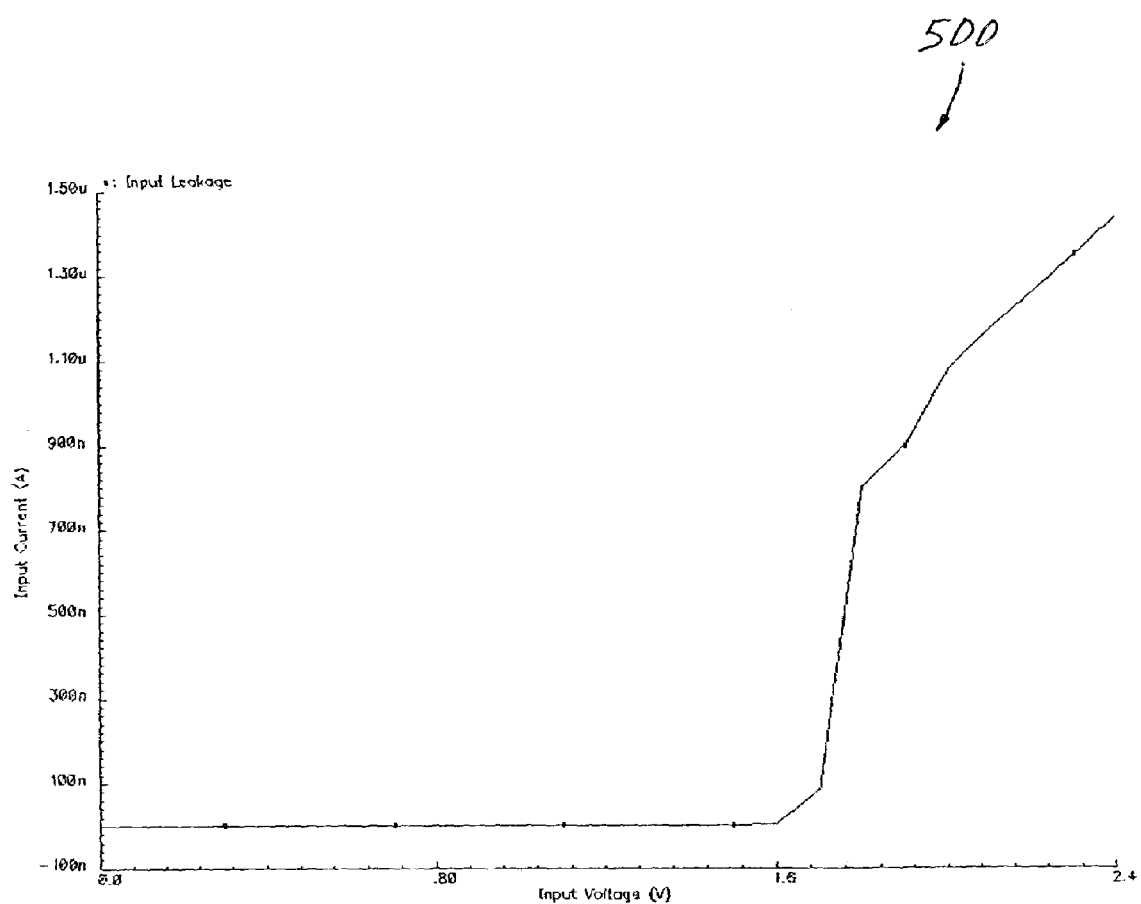
FIG. 5 is a diagram illustrating input current versus input voltage for the high-speed multi-channel LVDS repeater of FIG. 2.

FIG. 4 schematically depicts the control logic circuit 306 (see FIG. 3). In the preferred embodiment, the control logic circuit 306 comprises a NAND gate. It should be understood that each of the control logic circuits 307–309 is like the control logic circuit 306 of FIG. 4. It is also appreciated that in alternative embodiments, the NAND gate 306 may comprise any suitable number of inputs. Specifically, the NAND gate 306 includes a plurality of PMOS pull-up transistors MP9–MP11, a plurality of serially-connected NMOS transistors MN5–MN7, the inputs S10, C11, and POR coupled to the gate nodes of the NMOS transistors MN5–MN7, respectively, and an output P0 taken at a node located between the PMOS transistors MP9–MP11 and the NMOS transistors MN5–MN7. Because leakage current paths to Vcc may form within the NAND gates 306–309 when the respective PMOS transistors MP5–MP8 are activated (i.e., turned "on"), the NAND gate 306 (and similarly each of the NAND gates 307–309) further includes a blocking diode D1 (see FIG. 4) coupled between the PMOS transistors MP9–MP11 and the NMOS transistors MN5–MN7 to block the respective leakage current path. For example, the blocking diode D1 may comprise a Schottky blocking diode or any other suitable type of blocking element. As shown in FIG. 4, the cathode of the blocking diode D1 is connected to the output node P0, and the anode of the blocking diode D1 is connected to the drains of the respective PMOS transistors MP9–MP11. As a result, as indicated by the diagram 500 of FIG. 5, for operating conditions in which Vcc=1.5 volts and the input voltage ranges from 0–2.4 volts, the input leakage current within the front-multiplexed LVDS repeater 200 (see FIG. 2) is less than 20 µA, as required by the TIA/EIA-644 standard.

The presently disclosed front-multiplexed LVDS repeater circuit including the multiplexor 201 (see FIG. 3) will be better understood with reference to the following example. In this illustrative example, an input voltage is applied to the signal path A1 of the differential input A1,B1 having a voltage swing equal to the supply voltage level Vcc plus a predetermined threshold voltage level Vt. The input voltage applied to the signal path A1 therefore exceeds the supply voltage Vcc.

As a result, the PMOS transistor MP5 turns on and clamps the source-to-gate voltage of the PMOS transistor MP1 close to zero, thereby preventing the PMOS transistor MP1 from conducting. Further, all of the back-gate nodes of the respective PMOS transistors MP1–MP8 are connected through the Schottky blocking diode D0 to Vcc to prevent leakage current paths. Moreover, the Schottky blocking diode D1 included in the NAND gate 306 prevents a leakage current path within the circuit 306 when the PMOS transistor MP5 is turned on.

Figure 6:
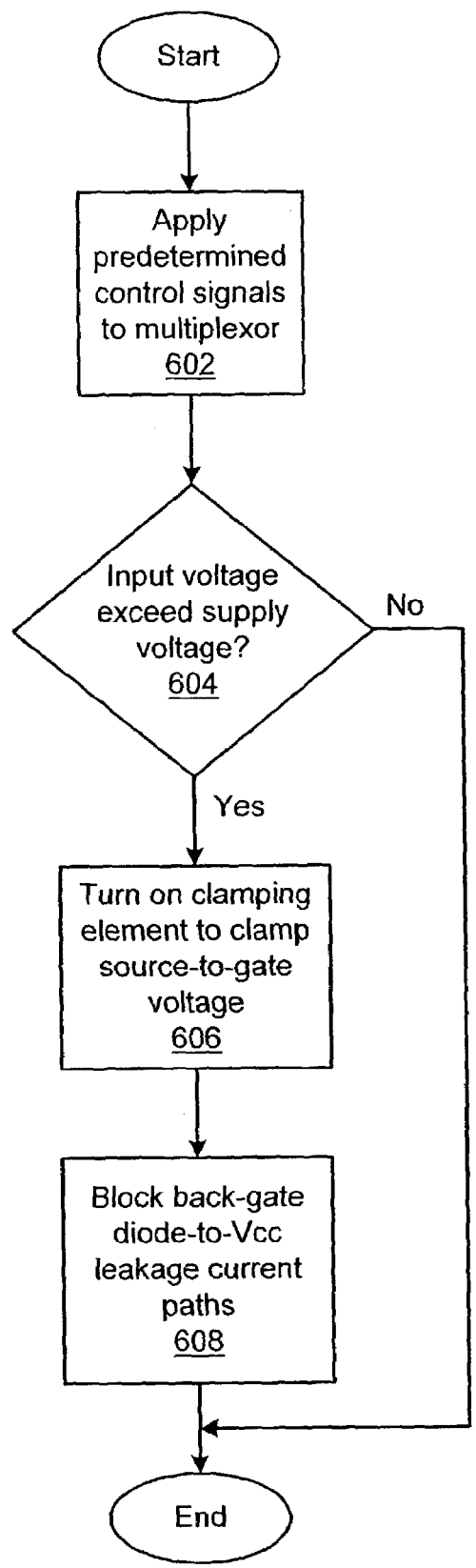
FIG. 6 is a flow diagram illustrating a method of operating the high-speed multi-channel LVDS repeater of FIG. 2.

A method of operating the presently disclosed front-multiplexed LVDS repeater circuit is illustrated by reference to FIG. 6. As depicted in step 602, at least one predetermined control signal is applied to the transmission gates 302–305 of the multiplexor 201 (see FIG. 3) to affect the desired routing of the differential inputs A1,B1 and A2,B2 to the differential output P1,Q1. A decision is then made, as depicted in step 604, as to whether the input voltage swing corresponding to one of the differential inputs A1,B1 and A2,B2 exceeds the supply voltage Vcc. In the event the input voltage exceeds the supply voltage Vcc, a clamping element such as a transistor is turned on, as depicted in step 604, to clamp the source-to-gate voltage of a PMOS transistor included in the corresponding transmission gate close to zero, thereby preventing the transistor from conducting. Further, the back-gate diode-to-Vcc leakage current paths are blocked, as depicted in step 606, in the clamping element and the PMOS transistor of the corresponding transmission gate by a blocking element such as a Schottky blocking diode.

It will further be appreciated by those of ordinary skill in the art that modifications to and variations of the above-described input current leakage correction for multi-channel LVDS front multiplexed repeaters may be made without departing from the inventive concepts disclosed herein. Accordingly, the invention should not be viewed as limited except as by the scope and spirit of the appended claims.

What is claimed is:

1. A driver circuit, comprising:
    a plurality of differential inputs;
    at least one differential output;
    a plurality of control inputs; and
    a multiplexor coupled between the differential inputs and the at least one differential output, the multiplexor being configurable by the control inputs to allow a selected one of the differential inputs to be routed to at least one differential output, the multiplexor including a plurality of transmission gates, each transmission gate including a first pass transistor corresponding to a respective signal path of one of the differential inputs,
    wherein the multiplexor further includes at least one first blocking element coupled between a back-gate node of each first pass transistor and a supply voltage to block a first leakage current path from the back-gate node to the supply voltage, and at least one second blocking element coupled between a gate node of each first pass transistor and the respective signal path corresponding thereto to block a second leakage current path from the respective signal path to the first pass transistor,
    a plurality of control circuits configured to provide the control inputs to the multiplexor,
    wherein each control circuit comprises at least one third blocking element operative to block a third leakage current path to the supply voltage within the control circuit.

2. The driver circuit of claim 1 wherein each control circuit comprises a NAND gate.

3. A driver circuit, comprising:
    a plurality of differential inputs;
    at least one differential output;
    a plurality of control inputs; and
    a multiplexor coupled between the differential inputs and the at least one differential output, the multiplexor being configurable by the control inputs to allow a selected one of the differential inputs to be routed to at least one differential output, the multiplexor including a plurality of transmission gates, each transmission gate including a first pass transistor corresponding to a respective signal path of one of the differential inputs,
    wherein the multiplexor further includes at least one first blocking element coupled between a back-gate node of each first pass transistor and a supply voltage to block a first leakage current path from the back-gate node to the supply voltage, and at least one second blocking element coupled between a gate node of each first pass transistor and the respective signal path corresponding thereto to block a second leakage current path from the respective signal path to the first pass transistor,
    wherein the second blocking element comprises a second transistor, and
    wherein the at least one first blocking element is further coupled between a back-gate node of the second transistor and the supply voltage to block a third leakage current path from the back-gate node of the second transistor to the supply voltage.

4. A driver circuit, comprising:
    a plurality of differential inputs;
    at least one differential output;
    a plurality of control inputs; and
    a multiplexor coupled between the differential inputs and the at least one differential output, the multiplexor being configurable by the control inputs to allow a selected one of the differential inputs to be routed to at least one differential output, the multiplexor including a plurality of transmission gates, each transmission gate including a first pass transistor corresponding to a respective signal path of one of the differential in puts,
    wherein the multiplexor further includes at least one first blocking element coupled between a back-gate node of each first pass transistor and a supply voltage to block a first leakage current path from the back-gate node to the supply voltage, and at least one second blocking element coupled between a gate node of each first pass transistor and the respective signal path corresponding thereto to block a second leakage current path from the respective signal path to the first pass transistor, and
    wherein the second blocking element comprises a second transistor,
    a resistor coupled between a gate node of the second transistor and the supply voltage, the resistor being operative to provide for Charged Device Model (CDM) protection.

5. A method of operating a driver circuit, the driver circuit including a plurality of differential inputs, at least one differential output, a plurality of control input, and a multiplexor coupled between the differential inputs and the at least one differential output, the method comprising the steps of:
    routing a selected one of the differential inputs to at least one differential output by the multiplexor based on the control inputs, the multiplexor including a plurality of transmission gates, each transmission gate including a first pass transistor corresponding to a respective signal path of one of the differential inputs;
    blocking a first leakage current path from a back-gate node of each first pass transistor to a supply voltage by at least one first blocking element;
    blocking a second leakage current path from the respective signal path to the first pass transistor by at least one second blocking element;
    providing the control inputs to the multiplexor by a plurality of control circuits; and
    blocking a third leakage current path to the supply voltage within each control circuit by at least one third blocking element.

6. A method of operating a driver circuit, the driver circuit including a plurality of differential inputs, at least one differential output, a plurality of control input, and a multiplexor coupled between the differential inputs and the at least one differential output, the method comprising the steps of:
    routing a selected one of the differential inputs to at least one differential output by the multiplexor based on the control inputs, the multiplexor including a plurality of transmission gates, each transmission gate including a first pass transistor corresponding to a respective signal path of one of the differential inputs;
    blocking a first leakage current path from a back-pate node of each first pass transistor to a supply voltage by at least one first blocking element; and
    blocking a second leakage current path from the respective signal path to the first pass transistor by at least one second blocking element,
    wherein the second blocking element comprises a second transistor, and further including the step of blocking a third leakage current path from a back-gate node of the second transistor to the supply voltage by the first blocking element.

7. A method of operating a driver circuit, the driver circuit including a plurality of differential inputs, at least one differential output, a plurality of control input, and a multiplexor coupled between the differential inputs and the at least one differential output, the method comprising the steps of:

routing a selected one of the differential inputs to at least one differential output by the multiplexor based on the control inputs, the multiplexor including a plurality of transmission gates, each transmission gate including a first pass transistor corresponding to a respective signal path of one of the differential inputs;

blocking a first leakage current path from a back-gate node of each first pass transistor to a supply voltage by at least one first blocking element; and blocking a second leakage current path from the respective signal path to the first pass transistor by at least one second blocking element;

wherein the second blocking element comprises a second transistor, and further including the step of blocking a third leakage current path from a back-gate node of the second transistor to the supply voltage by the first blocking element, providing for Charged Device Model (CDM) protection by a resistor coupled between a gate node of the second transistor and the supply voltage.

* * * * *